US008327298B2

(12) United States Patent
Faivishevsky et al.

(10) Patent No.: US 8,327,298 B2
(45) Date of Patent: Dec. 4, 2012

(54) SYSTEM AND METHOD FOR EVALUATING ERROR SOURCES ASSOCIATED WITH A MASK

(75) Inventors: Lev Faivishevsky, Kfar Saba (IL); Sergey Khristo, Ashdod (IL); Amir Moshe Sagiv, Beit-Zayit (IL); Shmuel Mangan, Rehovot (IL)

(73) Assignee: Applied Materials Israel, Ltd., Rehovot (IL)

( * ) Notice: Subject to any disclaimer, the term of this patent is extended or adjusted under 35 U.S.C. 154(b) by 238 days.

(21) Appl. No.: 12/713,109

(22) Filed: Feb. 25, 2010

(65) Prior Publication Data

US 2010/0235805 A1    Sep. 16, 2010

Related U.S. Application Data

(60) Provisional application No. 61/156,445, filed on Feb. 27, 2009, provisional application No. 61/156,450, filed on Feb. 27, 2009.

(51) Int. Cl.
*G06F 17/50*    (2006.01)

(52) U.S. Cl. ............... 716/50; 716/51; 716/52; 716/54; 716/55

(58) Field of Classification Search .................... 716/50, 716/51, 52, 54, 55
See application file for complete search history.

(56) References Cited

U.S. PATENT DOCUMENTS

| | | | | |
|---|---|---|---|---|
| 6,081,612 | A * | 6/2000 | Gutkowicz-Krusin et al. | 382/128 |
| 6,727,989 | B1 * | 4/2004 | Yin et al. | 356/400 |
| 2005/0196013 | A1 * | 9/2005 | Rhoads | 382/100 |

FOREIGN PATENT DOCUMENTS

| | | |
|---|---|---|
| WO | 2006089630 A1 | 8/2006 |
| WO | 2007088542 A2 | 8/2007 |

OTHER PUBLICATIONS

Japanese Patent Office Official Action in JP 2010-044464, Aug. 25, 2011.

* cited by examiner

*Primary Examiner* — Sun Lin
(74) *Attorney, Agent, or Firm* — Tarek N. Fahmi, APC

(57) ABSTRACT

Evaluating error sources associated with a mask involves: (i) receiving data representative of multiple images of the mask that were obtained at different exposure conditions; (ii) calculating, for multiple sub-frames of each image of the mask, values of a function of intensities of pixels of each sub-frame to provide multiple calculated values; and (iii) detecting error sources in response to calculated values and in response to sensitivities of the function to each error source.

24 Claims, 11 Drawing Sheets

910

920

SYSTEM AND METHOD FOR EVALUATING ERROR SOURCES ASSOCIATED WITH A MASK

RELATED APPLICATIONS

This application is a NONPROVISIONAL of, claims priority to and incorporates by reference U.S. Provisional Patent Applications 61/156,445, filed 27 Feb. 2009, and 61/156,450, filed 27 Feb. 2009.

FIELD OF THE INVENTION

This invention is generally in the field of evaluating masks and especially for evaluating error sources associated with a photolithographic mask.

BACKGROUND OF THE INVENTION

The performance of micro-electronic devices has always been limited by the variations found in the dimensions of their critical features, termed critical dimensions or CD. Microelectronic devices are often manufactured using photo lithographic masks (also referred to as masks or reticles) in a photolithography process. The latter is one of the principal processes in the manufacture of semiconductor devices, and consists of patterning the wafer's surface in accordance with the circuit design of the semiconductor devices to be produced. Such a circuit design is first patterned on a mask. Hence, in order to obtain operating semiconductor devices, the mask must be defect free. Masks are manufactured by a complex process and can suffer from one or more error sources.

Moreover, the mask is often used in a repeated manner to create many dies on the wafer. Thus, any defect on the mask will be repeated multiple times on the wafer and will cause multiple devices to be defective. Establishing a production-worthy process requires tight control of the overall lithography process. Within this process, CD control is a determining factor with respect to device performance and yield.

Various mask inspection tools have been developed and are available commercially. According to the known techniques of designing and evaluating masks, the mask is created and used to expose therethrough a wafer, and then a check is performed to determine whether the features of the mask have been transferred to the wafer according to the design. Any variations in the final features from the intended design necessitate modifying the design, creating a new mask, and exposing a new wafer.

Gridded design rule (GDR) masks were developed in order to facilitate the manufacturing of very small features. GDR masks are also termed single dimensional masks (1D masks) as they include patterns that include parallel lines and spacing between these parallel lines.

There is a need to provide systems and methods for evaluating at least one error source of a mask.

SUMMARY OF THE INVENTION

A method for evaluating error sources associated with a mask, the method includes: receiving data representative of multiple images of the mask, the multiple images were obtained at different exposure conditions; calculating, for each sub-frame out of a plurality of sub-frames of the multiple images, a function of intensities of pixels of the sub-frame to provide multiple calculated values; and detecting error sources in response to calculated values and in response to sensitivities of the function to each error source.

A method for evaluating error sources associated with a mask, the method can include: receiving data representative of an image of the mask; calculating for each sub-frame out of a plurality of sub-frames of the image of the mask multiple functions of intensities of pixels of the sub-frame to provide multiple calculated values; detecting error sources in response to calculated values and in response to sensitivities of each function to each error source.

A method for evaluating error sources associated with a mask, the method can include: receiving data representative of multiple images of the mask; calculating for each sub-frame out of a plurality of sub-frames of each image of the mask a relationship value that represents a relationship between values of multiple functions of intensities of pixels of the sub-frame; and compensating for illumination power variations that affect the multiple images in response to relationship values of sub-frames of the multiple images.

A system for evaluating error sources associated with a mask, the system can include: an interface that receives data representative of multiple images of the mask that were obtained at different exposure conditions; and a processor that calculates, for each sub-frame out of a plurality of sub-frames of the multiple images, a function of intensities of pixels of the sub-frame to provide multiple calculated values; and detecting error sources in response to calculated values and in response to sensitivities of the function to each error source.

A system for evaluating error sources associated with a mask, the system includes: an interface that receives data representative of an image of the mask; and a processor that calculates, for multiple sub-frames of each image of the mask, values of multiple functions of intensities to provide multiple calculated values; and determines a contribution of each error source in response to calculated values and in response to sensitivities of the function to each error source.

A system for evaluating error sources associated with a mask, the system includes: an interface that receives data representative of multiple images of the mask; wherein each image comprises a plurality of sub-frames; and a processor that calculates for each sub-frame of multiple sub-frames of each image of the mask a relationship value that represents a relationship between values of multiple functions of intensities of the sub-frame; and compensates for illumination power variations that affected the multiple images in response to relationship values of sub-frames of different images.

A method for evaluating error sources associated with a mask, the method includes: receiving image data representative of an image of a region of the mask; wherein the region of the mask comprises a mask pattern; and detecting at least one error source in the mask pattern based on the image data and on a sensitivity of a mask image obtaining process to a first and second error sources; wherein the sensitivity of the mask image obtaining process to a first and second error sources is calculated by: receiving calibration data representative of a image of a reference pattern, an image a first perturbed pattern and an image of a second perturbed pattern, wherein the first perturbed pattern reflects an induction of the first error source to the reference pattern, wherein the second perturbed pattern reflects an induction of the second error source to the reference pattern; and evaluating the sensitivity of the mask image obtaining process to the first and second error sources based on a relationship between the received calibration data.

A method for evaluating error sources associated with a mask, the method includes: receiving calibration data representative of an image of a reference pattern, an image a first perturbed pattern and an image of a second perturbed pattern, wherein the first perturbed pattern reflects an induction of a first error source to the reference pattern, wherein the second perturbed pattern reflects an induction of a second error source to the reference pattern; evaluating a sensitivity of a mask image obtaining process to the first and second error sources based on a relationship between the received calibration data; receiving image data representative of an image of a region of the mask; wherein the region of the mask comprises a mask pattern; detecting at least one error source in the mask pattern based on the image data and on the sensitivity of the mask image obtaining process to the first and second error sources.

A system for evaluating error sources associated with a mask, the system comprising: an interface that receives image data representative of an image of a region of the mask; wherein the region of the mask comprises a mask pattern; and a processor that is configured to detect at least one error source in the mask pattern based on the image data and on a sensitivity of a mask image obtaining process to a first and second error sources; wherein the sensitivity of the mask image obtaining process to a first and second error sources is calculated by: receiving calibration data representative of a image of a reference pattern, an image a first perturbed pattern and an image of a second perturbed pattern, wherein the first perturbed pattern reflects an induction of the first error source to the reference pattern, wherein the second perturbed pattern reflects an induction of the second error source to the reference pattern; and evaluating the sensitivity of the mask image obtaining process to the first and second error sources based on a relationship between the received calibration data.

BRIEF DESCRIPTION OF THE DRAWINGS

In order to understand the invention and to see how it may be carried out in practice, an embodiment will now be described, by way of non-limiting example only, with reference to the accompanying drawings, in which.

DETAILED DESCRIPTION

Methods and system for evaluating error sources of a mask are provided. The mask is used during a photolithographic process. One or more images of the mask can be obtained at one or more exposure conditions. The exposure conditions can differ from each other. One or more functions of intensities of pixels of sub-frames of these one or more images are calculated. The results of the calculation are referred to as calculated values. These calculated values can provide an indication about error sources in the mask.

It is noted that one or more images of a mask can be obtained as well as one or more images of portions of a mask can be obtained. For simplicity of explanation the "image of mask" also means an image of a portion of a mask.

According to various embodiments of the invention multiple images of the mask can be obtained and sub-frames of these images are processed by applying a single function. This scenario is referred to as "multiple images, single function".

According to various embodiments of the invention a single image of the mask can be obtained and one or more sub-frames of this image are processed by applying multiple functions. This scenario is referred to as "single image, multiple function".

Yet according to various embodiments of the invention multiple images of the mask can be obtained and one or more sub-frames of each image can be processed by applying multiple functions.

Multiple Images, Single Function

Figure 1:
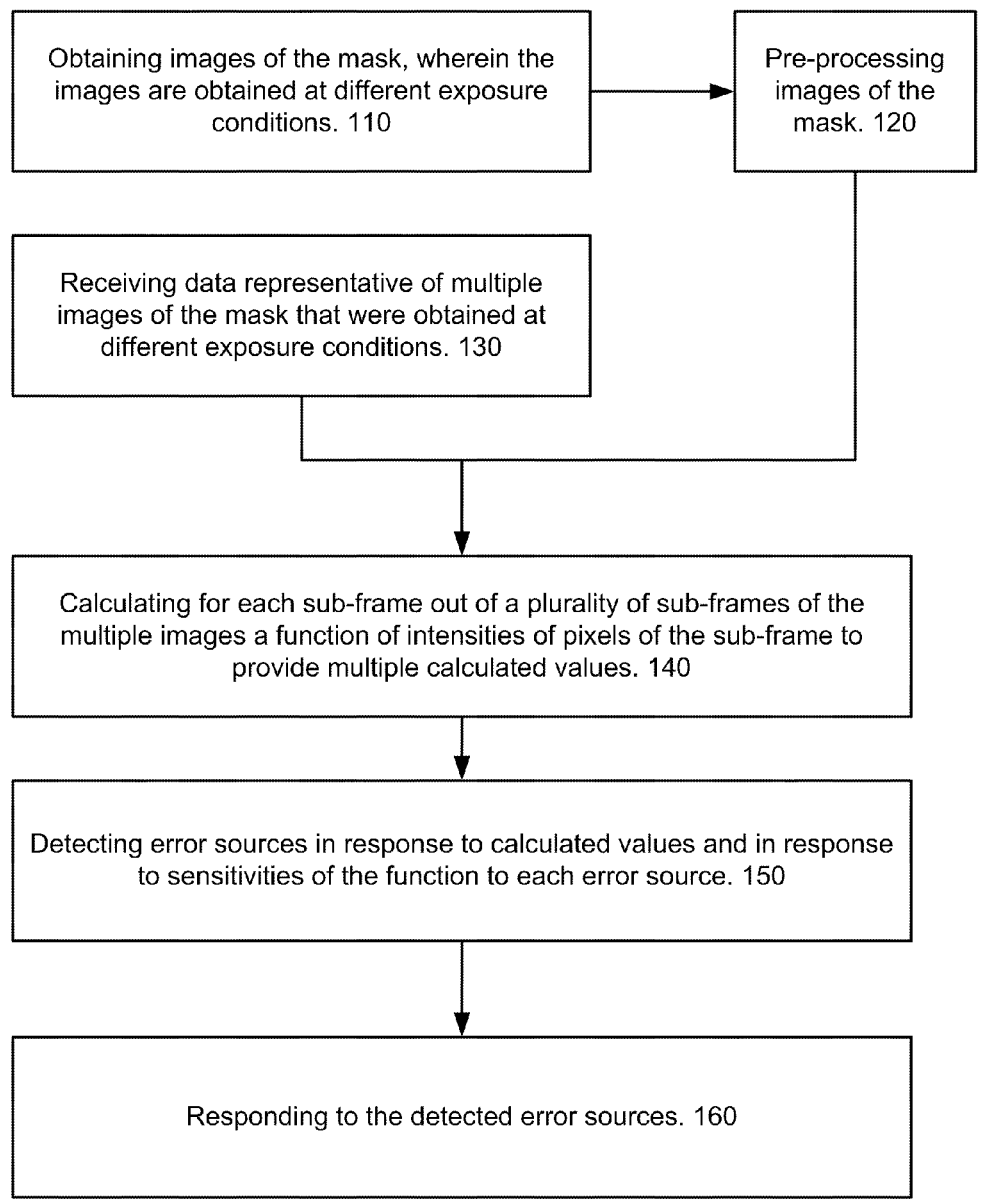
FIG. 1 is a flow chart of a method, according to an embodiment of the invention.

FIG. 1 illustrates method 100 according to an embodiment of the invention. Method 100 evaluates error sources associated with a mask, and more specifically can provide an indication of a presence of an error source and its contribution to an image of a mask.

Method 100 can start by stage 110, 120 or 130.

Stage 110 includes optically obtaining images of the mask, wherein the images are obtained at different exposure conditions. Each image includes sub-frames. The sub-frames of each image can be of the same size and shape. Their size and shape can be selected in response to the shape and size of patterns of interest. For example—a sub-frame can be selected to include a multiple integer of features that form a repetitive pattern.

It is noted that one or more images can be obtained at the same exposure condition while one or more other images can be obtained at another exposure condition.

As a rule of thumb, by selecting larger sub-frames can contribute to the accuracy of a computation of the function of an intensity of the pixels of the sub-frame, especially when performing averaging over larger sub-frames. Selecting smaller sub-frames can provide more values of the function of the intensity integral of a sub-frame. For example, a 1,000, 000×1,000,000 pixel image of a mask can be split to multiple sub-frames, each includes 1,000×1,000 pixels, but this is not necessarily so.

The different exposure conditions can be selected in response to error sources of interest. For example—different exposure conditions can be set so that different exposure conditions intensify the effect of different error sources under different illumination conditions. Thus, a first illumination condition can be selected so as to obtain an image that is more affected (and even dominated by) a first error source while a second illumination condition can be selected so as to obtain an image that is more affected (and even dominated by) a second error source.

Stage 110 can be executed by an image obtaining system such as an Aerial imager and especially by the AREA 193 of Applied Materials Inc. from Santa Clara, Calif. Stage 110 can be followed by stage 120.

The exposure conditions can include numerical aperture value, size and shape of apertures, light coherency, and the like.

According to an embodiment of the invention one of the images can be obtained by applying an aerial imaging condition and at least one other image can be obtained at an exposure condition that differs from aerial imaging condition. The aerial imaging condition is expected to be similar to the illumination conditions imposed by a lithographic manufacturing tool such as a stepper.

According to another embodiment of the invention one of the images can be obtained by applying an aerial imaging condition and at least one other image is obtained at low numerical aperture.

According to a further embodiment of the invention multiple images can be acquired under different optical imaging conditions.

Stage 120 includes pre-processing images of the mask.

Stage 120 outputs data representative of the images. Stage 120 of processing can include generating gray level image, performing focus corrections, aberration compensation, transformation of the images to a required data format and the like. Stage 120 can be followed by stage 130.

Stage 130 includes receiving data representative of multiple images of the mask that were obtained at different exposure conditions. Each image can include multiple sub-frames.

Stage 130 is followed by stage 140 of calculating for each sub-frame out of a plurality of sub-frames of the multiple images a function of intensities of pixels of the sub-frame to provide multiple calculated values.

It is noted that stage 140 can include calculating the function for all sub-frame of an image, for all sub-frame of all images, for some sub-frames of an image or for some sub-frames of all images.

According to an embodiment of the invention the function can be an intensity integral of the pixels sub-frame, a sum of the intensities of the pixels, a weighted sum of the intensities of the pixels, an average of the intensities of the pixels, and the like.

Yet according to another embodiment of the invention the function can be variance of the intensities of pixels of the sub-frame.

Yet according to a further embodiment of the invention the function can be a standard deviation of the intensities of pixels of the sub-frame. It is noted that other statistical functions, probabilistic functions or yet further function can be applied. It is noted the some pixels can be ignored off.

An example of a calculation of a function that is intensities integral of pixels of a sub-frame is illustrated in PCT patent application publication Serial No. WO2007/088542A2 entitled "Method and system for evaluating a variation in a parameter of a pattern", which is incorporated herein by its entirety. It has been shown that changes of a characteristic (such as a critical dimension) of an article generated by the mask can be estimated in view of the average of the intensity integral of the sub-frame.

According to yet other embodiments of the invention stage 140 can include calculating multiple functions of intensities of pixels of a sub-frame to provide multiple calculated values.

The calculation of multiple functions can reduce the number of images that should be obtained in order detect error sources and, additionally or alternatively, can be used in increase the reliability of the detection of the error sources.

Stage 140 is followed by stage 150 of detecting error sources in response to calculated values and in response to sensitivities of the function to each error source.

A sensitivity of the function to a certain error source can represent a ratio between a value of the function and the contribution of that certain error source to the value.

Stage 150 can include evaluating a contribution of an error source to the value of one or more function. The evaluating can include determining what are the error sources of a mask, indicating whether the mask is functional or not, and the like.

An error source can be a variation in a parameter of the mask or one of the components of the mask; can be a value of a parameter of the mask that differs from a desired value and the like. An error source can be limited to a small area of the mask; can appear on different portions of the mask and even on the entire mask. Non limiting examples of error sources can include mask thickness variations, mask reflectivity variations, variations of duty cycle of patterns the mask, variations in a transparency of a layer of a mask, variations of attenuation of a mask, variation in an attenuation of the mask, variations in a width of a pattern of a mask, variations of phase shifts introduced by the mask, thickness un-uniformity of a molybdenum silicide (MoSi2) layer of a mask, and the like.

Multiple error sources or more exactly the contribution of each error source out of multiple error sources can be learnt from comparing multiple values of the function of an intensity of pixels of each sub-frame integral that are expected to be equal to each other without the presence of error sources.

This comparison can include comparing between calculated values associated with sub-frames positioned at the same location within different frames.

These sensitivities can be fed to method 100 or can be calculated during method 100.

Figure 2:
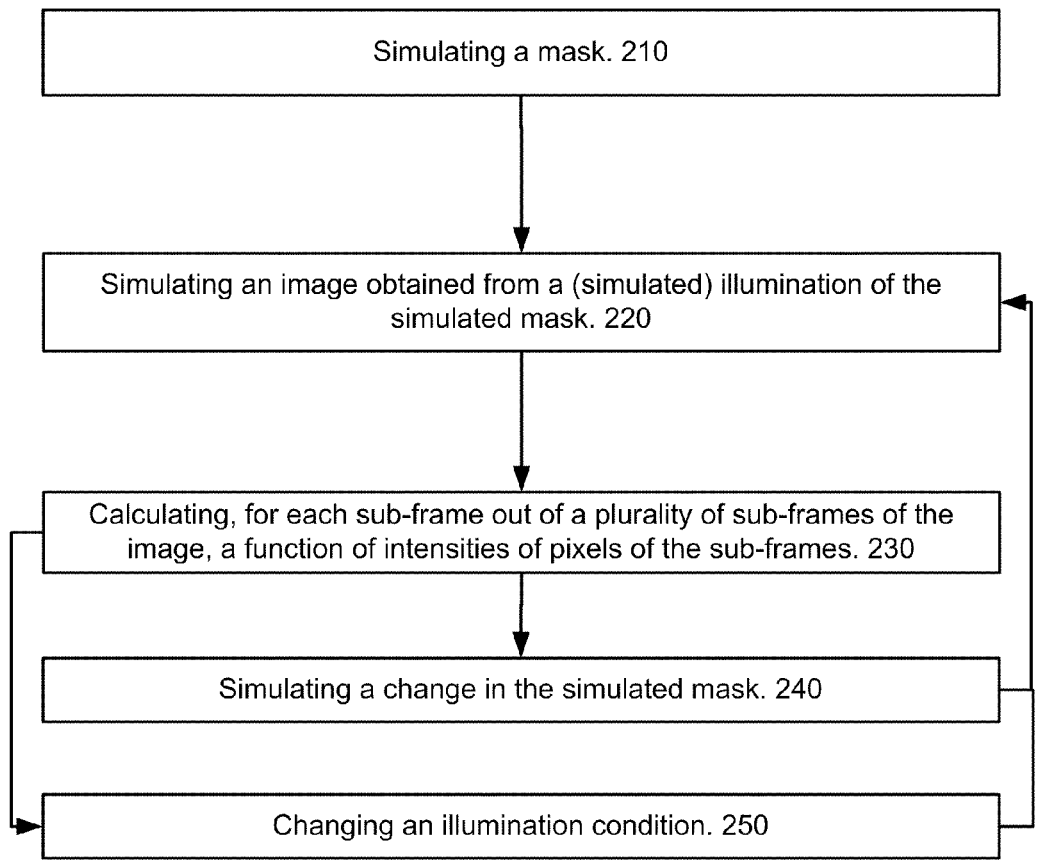
FIG. 2 is a flow chart of a method, according to an embodiment of the invention.

FIG. 2 illustrates method 200 for calculating sensitivities of the function to each error source according to an embodiment of the invention.

Method 200 repetitively simulates changes in a simulated mask, simulates images obtained from an illumination of the simulated mask, calculates a function of intensities for pixels of simulated sub-frames, and compares between calculated values.

Method 200 starts by stage 210 of simulating a mask.

Stage 210 is followed by stage 220 of simulating an image obtained from a (simulated) illumination of the simulated mask.

Stage 220 is followed by stage 230 of calculating, for each sub-frame out of a plurality of sub-frames of the image, a function of intensities of pixels of the sub-frames.

Stage 230 is followed by stage 240 of simulating a change in the simulated mask.

Stage 240 is followed by stage 220 until a control criterion is fulfilled. The control criterion can be a maximal number of allowed iterations, but this is not necessarily so and other control criteria can be defined.

According to another embodiment of the invention stage 230 is followed by stage 250 of changing an illumination condition and jumping to stage 220.

While method 200 illustrates a simulation based calculation of the sensitivities it is noted that these sensitivities can be calculated in other manners. For example—images of masks that have known error sources can be illuminated to provide images that are then processed in order to evaluate the sensitivities. These images can be obtained at different illumination conditions.

Referring back to FIG. 1, stage 150 can be followed by responding to the detected error sources. This stage can include repairing the mask, defining the mask as a faulty mask, defining the mask as functional, generating a repair indication of the mask and the like.

Stage 160 can include determining how to respond to the detected error sources by evaluating their printability or otherwise evaluating whether these error sources will affect an article manufactured by illuminating the mask. Stage 160 can include determining variations of a feature of an article that is manufactured by utilizing the mask. If these variations are not acceptable then the mask can be sent to be repaired or be rejected.

Stage 160 can include at least one of the following or a combination thereof: (i) providing a qualification criteria for a mask to be shipped out of a mask shop; (ii) providing input to a mask generation process; (iii) provide input to an article manufacturing process; (iv) provide input to a mask model used in lithographic simulations; (v) provide correction maps for a lithography stepper; (vi) identify areas that are characterized by a larger then expected feature parameter variation.

According to an embodiment of the invention the mask can be a gridded design rule mask.

Single Image, Multiple Functions

Figure 3:
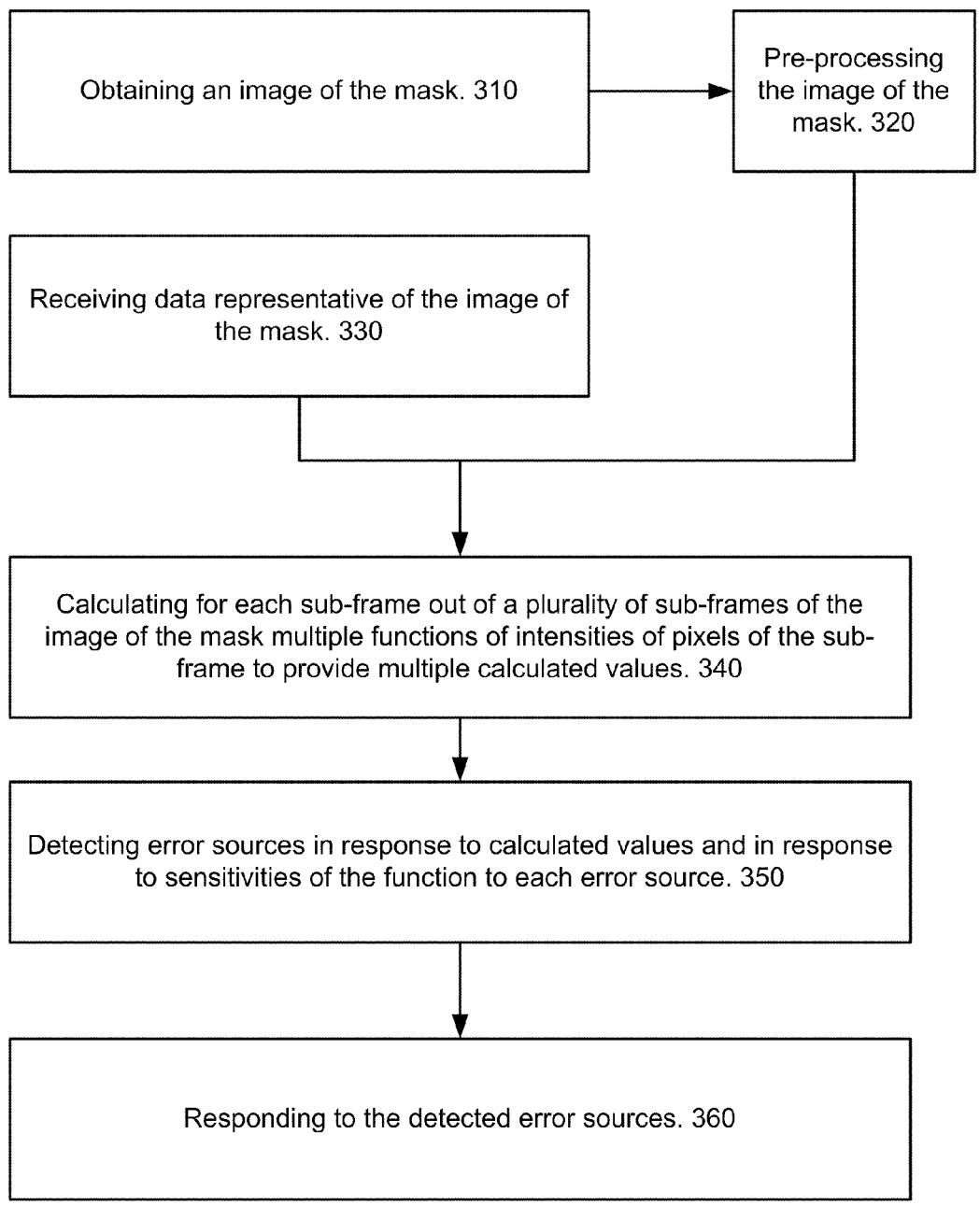
FIG. 3 is a flow chart of a method, according to an embodiment of the invention.

FIG. 3 illustrates method 300 according to an embodiment of the invention. Method 300 evaluates error sources associated with a mask, and more specifically can provide an indication of a presence of an error source and its contribution to an image of a mask.

Method 300 can start by either one of stages 310, 320 or 330.

Stage 310 includes optically obtaining an image of the mask. The image of the mask includes sub-frames. The sub-frames can be of the same size and shape. Their size and shape can be selected in response to the shape and size of patterns of interest. For example—a sub-frame can be selected to include a multiple integer of features that form a repetitive pattern.

Stage 310 can be executed by an image obtaining system such as an Aerial imager and especially by the AREA 193 of Applied Materials Inc. from Santa Clara, Calif. Stage 310 can be followed by stage 320.

The image can be obtained by applying an aerial imaging condition but this is not necessarily so.

Stage 320 includes pre-processing the image of the mask, wherein the images are obtained at different exposure conditions. Stage 320 outputs data representative of the image.

Stage 330 includes receiving data representative of the image of the mask.

Stage 330 is followed by stage 340 of calculating, for each sub-frame out of multiple sub-frames of the image of the mask, multiple functions of intensities of pixels of the sub-frame to provide multiple calculated values.

Stage 340 is followed by stage 350 of detecting one or more error sources in response to calculated values and in response to sensitivities of each of the functions to each error source.

Stage 350 can be followed by stage 360 of responding to the detected error sources.

Illumination Fluctuation Compensation

Figure 4:
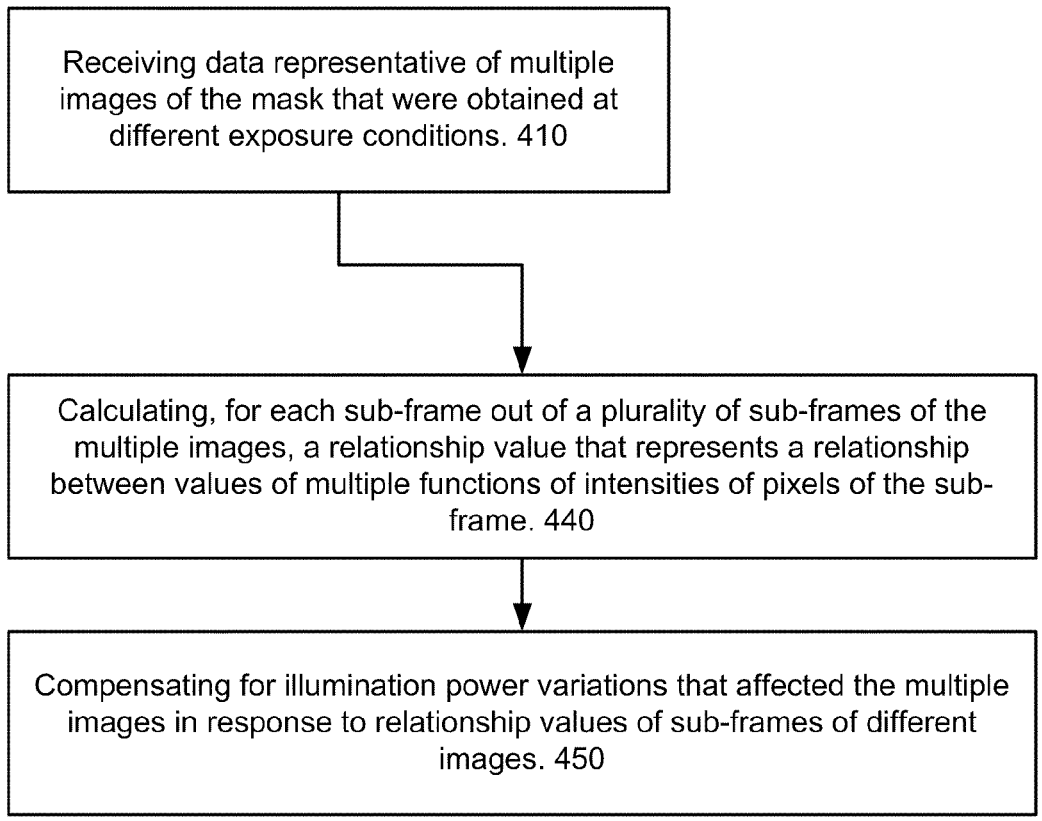
FIG. 4 is a flow chart of a method, according to an embodiment of the invention.

FIG. 4 illustrates method 400 for evaluating error sources associated with a mask.

Method 400 can include stage 410 of receiving data representative of multiple images of the mask. Each image includes sub-frames.

Stage 410 is followed by stage 420 of calculating, for each sub-frame out of a plurality of sub-frames of the multiple images, a relationship value that represents a relationship between values of multiple functions of intensities of pixels of the sub-frame.

Stage 420 can include calculating relationship values for sub-frames that belong to different images—especially to different images that were obtained while the illumination sources outputted light of varying intensities.

Stage 420 is followed by stage 430 of compensating for illumination power variations that affected the multiple images in response to relationship values of sub-frames of different images.

Stage 420 can include calculating a relationship value that represents a ratio between an average of an intensity integral of the sub-frame and a standard deviation of the intensity integral of the sub-frame.

System

Figure 5:
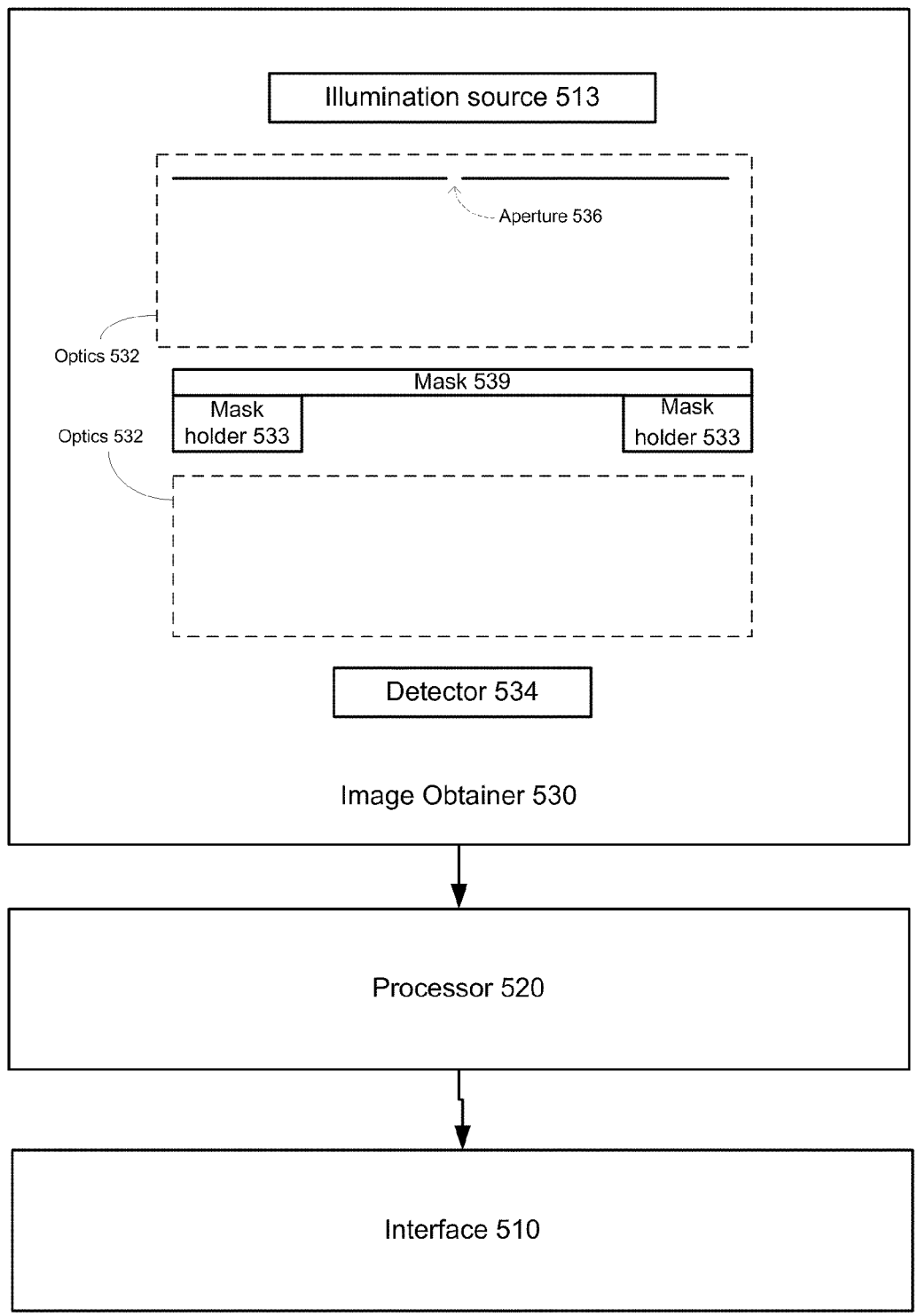
FIG. 5 illustrates a system, according to an embodiment of the invention.

Reference is made to FIG. 5 schematically showing, by way of a block diagram, an example of system 500 according to an embodiment of the invention.

System 500 includes interface 510 and processor 520. FIG. 5 also illustrated system 500 as including image obtainer 530 that obtains the multiple images of the mask at different exposure conditions. Image obtainer can include illumination source 531, optics 532, mask holder 533 and detector 534. Image obtainer can be an Aerial inspection tool or can be included in such a tool. Optics 532 can include one or more optical element (such as a lens, aperture 536, a spatial filter, and the like) located between illumination source 531 and a mask that is heal by mask holder 533 as well as one or more optical elements located between mask holder 533 and detector 534.

Interface 510 can include a memory bank, one or more buses as well as software components.

Interface 510 can receive data representative of multiple images of the mask that were obtained at different exposure conditions.

Processor 520 can perform at least one of methods 100, 200, 300, 400 or a combination thereof.

For example, processor 520 can calculate, for each sub-frame out of a plurality of sub-frames of the multiple images, a function of intensities of pixels of the sub-frame to provide multiple calculated values; and detecting error sources in response to calculated values and in response to sensitivities of the function to each error source.

For another example, processor 520 can calculate, for multiple sub-frames of each image of the mask, values of multiple functions of intensities to provide multiple calculated values; and determines a contribution of each error source in response to calculated values and in response to sensitivities of the function to each error source.

For another example, processor 520 can calculate for each sub-frame of multiple sub-frames of each image of the mask a relationship value that represents a relationship between values of multiple functions of intensities of the sub-frame; and compensates for illumination power variations that affected the multiple images in response to relationship values of sub-frames of different images.

Mathematical Analysis—GDR Mask

To treat the recovery of mask error sources, a TCC (Transmission Cross Coefficient) approach for the computation of the images obtained can be taken. The TCC approach is justified under the assumptions that both the "thin" (i.e. Kirchhoff) mask approximation and the Hopkins approximation hold. The TCC is has a particularly compact form for mask patterns that have very well defined spectral content. Indeed, a dense 1D GDR mask pattern is essentially represented by a single spatial frequency.

The TCC approach can be used to derive expressions for the response of the average intensity of the aerial image to small perturbations (error sources) of GDR mask parameters under a particular set of exposure conditions.

This mathematical analysis will illustrate that a combination of two or more measurements of the average intensity performed under different exposure conditions are enough to recover the nature and strength of the mask error source. For concreteness, the following mathematical analysis focus on attenuated (embedded) phase shift masks, although the results are applicable (with adequate modifications) also to other types of 1D mask patterns.

The spectrum of an aerial image is given by equation (1)

$$\tilde{I}(f,g)=\iint TCC(f+f',g+g';f',g')\tilde{O}(f+f',g+g')\tilde{O}\cdot(f',g')df'dg'. \quad (1)$$

Wherein f,g,f',g' denote spatial frequencies, $\tilde{I}$ is the intensity of the aerial image, $\tilde{O}$ is a function that describes the transmission (including phase) of the mask, and the tilde denotes the Fourier transform of a quantity, viz. $\tilde{X}(f,g)=F\{X(x,y)\}$. TCC (the transmission cross coefficient) is a function of four variables that completely describes the effect of the optical system, and is defined as:

$$TCC(f',g';f'',g'')=\iint \tilde{J}(f,g)\tilde{H}(f+f',g+g')\tilde{H}(f+f',g+g')\tilde{H}(f+f'',g+g'')dfdg. \quad (2)$$

Here $\tilde{J}$ and $\tilde{H}$ denote, respectively, the mutual intensity of the illumination source and the transfer function of the collection optics.

A function of the intensities of pixels of a sub-frame of an aerial image provides an indication of an average intensity of these pixels), corresponding to f=g=0:

$$I_{av}=\tilde{I}(0,0)=\iint TCC(f,g;f,g)|\tilde{O}(f,g)|^2 dfdg. \quad (3)$$

Notice that in this case the TCC assumes a particularly simple form:

$$TCC(f',g';f',g')=\iint \tilde{J}(f,g)|\tilde{H}(f+f',g+g')|^2 dfdg. \quad (4)$$

Since the effect of optical aberrations on image formation is captured entirely by the phase of $\tilde{H}$, eq. (4) implies that the average intensity is insensitive to aberrations.

The TCC can be applied to a 1D (lines-and-spaces) mask pattern. Let p be the pitch, and d the line width. Additionally, denote by $t_{bg}$ and $t_{fg}$ the transmission and phase of the pattern's lines and spaces, respectively. For example, an attenuated low-transmission MoSi (6%) Phase Shift Mask (PSM) corresponds to $t_{bg}=-0.25$ and $t_{fg}=1$. With these definitions, the spectrum of such a pattern is given by:

$$\tilde{O}(f) = \left[t_{bg} + (t_{fg} - t_{bg})\frac{d}{p}\frac{\sin(\pi f d)}{\pi f d}\right]\delta(f) ++ \quad (5)$$

$$(t_{fg} - t_{bg})\frac{d}{p}\frac{\sin(\pi f d)}{\pi f d}\sum_k \left[\delta\left(f - \frac{k}{p}\right) + \delta\left(f + \frac{k}{p}\right)\right].$$

It is noted that this spectrum is composed of harmonics at spatial frequencies k/p. Since, in practical cases, TCC (0,0)=1, we may substitute in (3) and obtain:

$$I_{av} = \tilde{I}(0, 0) = \left[t_{bg} + (t_{fg} - t_{bg})\frac{d}{p}\right]^2 ++ \left[(t_{fg} - t_{bg})\frac{d}{p}\right]^2 \quad (6)$$

$$\sum_k \left\{\left(\frac{\sin(\pi k d/p)}{\pi k d/p}\right)^2 \left[TCC\left(\frac{k}{p},\frac{k}{p}\right) + TCC\left(-\frac{k}{p},-\frac{k}{p}\right)\right]\right\}.$$

In practice, in GDR patterns typically only the $0^{th}$ and $1^{st}$ (or $0^{th}$ and $-1^{st}$) diffraction orders contribute to image formation. This reflects the fact that GDR is used deliberately to bring $k_1$ as close as practically possible to its lowest theoretical limit, thereby benefiting from the advantages of two-beam imaging in terms of MEEF and polarization, and, of course, die size (c.f. §2).

The formulation in eqs. (5) and (6) is more general and facilitates extensions to more general cases. The "selection" of the diffraction orders that actually contribute to aerial image formation is implicit in the TCC in eq. (6).

It is evident from the general formula (6) that a function that is an average of intensities of pixels of a sub-frame has two distinctive contributions. The first contribution—hereafter $I_0$—depends solely on the mask pattern, and is completely independent of the details of the optical configuration of the image acquisition system:

$$I_0 = \left[t_{bg} + (t_{fg} - t_{bg})\frac{d}{p}\right]^2. \quad (7)$$

The second contribution, which depends on the particular optical conditions, depends also on higher pattern harmonics:

$$I_{higher} = \left[(t_{fg} - t_{bg})\frac{d}{p}\right]^2 \quad (8)$$

$$\sum_k \left\{\left(\frac{\sin(\pi k d/p)}{\pi k d/p}\right)^2 \left[TCC\left(\frac{k}{p},\frac{k}{p}\right) + TCC\left(-\frac{k}{p},-\frac{k}{p}\right)\right]\right\}$$

Thus, $I_{av}=I_0+I_{higher}$.

Small perturbations of mask pattern (error sources) parameters are manifested in eq. (6). Concentrating on attenuating phase shift mask line patterns (attPSM L&S patterns), two types of feasible (and common) perturbations can be distinguished from each other.

First, the duty cycle of the features on the mask—d/p—may differ from the nominal value. This may occur due to mask writing errors (owing to width variations of the writing beam), or during mask development. The underlying origin of this specific type of error implies, then, that the mask pattern has the nominal pitch, but the line width d varies from the intended value. Assuming the deviation from nominal line width value is small, the effect on the average intensity is captured by a simple Taylor series (typically the $1^{st}$ or $2^{nd}$ order terms suffice). The effect can be expressed by the following equation:

$$\delta I_{av}(\Delta d) \approx \frac{\partial I_{av}}{\partial d}\Delta d + \frac{1}{2}\frac{\partial^2 I_{av}}{\partial d^2}\Delta d^2 + \ldots \quad (9)$$

Here $\delta I_{av}=(I_{av}-I_{av,\,nom})/I_{av,\,nom}$ is the change in average intensity relative to the nominal average intensity $I_{av,\,nom}$ that is obtained for a nominal, defect free mask.

Second, a MoSi deposition error may occur, leading to a variation in film's phase shift $\phi$, that is coupled to a variation in transmission value. As the attenuation is an exponential function of film thickness, while the phase shift is proportional to the thickness, one can schematically write $$t_{bg}(\phi)=t_0\exp[-q\phi-i\phi]. \quad (10)$$

Where $t_0$ is a parameter that depends on the reflectance of the MoSi film, while q is a parameter that describes the sensitivity of transmission to film thickness, and is proportional to $\kappa/(n-1)$, where $\kappa$ and n are the imaginary and real parts of the MoSi's refractive index.

The sensitivity of the average intensity to MoSi thickness through its dependence on MoSi phase (and through this on its transmission), can be expressed by the following equation:

$$\delta I_{av}(\Delta \phi) \approx \frac{\partial I_{av}}{\partial \phi}\Delta \phi + \frac{1}{2}\frac{\partial^2 I_{av}}{\partial \phi^2}\Delta \phi^2 + \ldots \quad (11)$$

Considering a mask that is endowed with both types of perturbations (i.e. both mask line width and MoSi thickness deviate from their intended values)—a single measurement of the average intensity error is not enough to recover the specific error source.

The error sources (and more specifically—the contribution of error sources to the images) can be evaluated if different images of the mask, are obtained at different exposure conditions.

Denoting the two exposure conditions by $EC_1$ and $EC_2$, measurement of average intensities for these two optical modes gives, upon substitution in (9) and (11) (and by omitting higher order derivatives):

$$\delta I_{av}^{(EC_1)} \approx \frac{\partial I_{av}}{\partial d}\bigg|_{EC_1} \Delta d + \frac{\partial I_{av}}{\partial \phi}\bigg|_{EC_1} \Delta \phi + \ldots \quad (12)$$

$$\delta I_{av}^{(EC_2)} \approx \frac{\partial I_{av}}{\partial d}\bigg|_{EC_2} \Delta d + \frac{\partial I_{av}}{\partial \phi}\bigg|_{EC_2} \Delta \phi + \ldots$$

With $\delta I_{av}^{(EC_1)}$, $\delta I_{av}^{(EC_2)}$ measured, and the sensitivities of the function (also referred to as partial derivatives of $I_{av}$ per error source) and per exposure condition computed, eqs. (12) can be solved for the unknown mask error sources $\Delta d$, $\Delta \phi$. In some cases, a higher partial derivative (typically w.r.t phase) may be required, but the principle is however the same.

$EC_1$ can be an aerial imaging condition. The other exposure condition $EC_1$ can be chosen is such a way as to maximize the discrepancy of sensitivities (partial derivatives) between the two exposure conditions. A practical choice is to choose an on-axis low-NA/low-σ combination for $EC_2$, that satisfies $$\frac{\lambda}{NA(1+\sigma)} > p. \quad (13)$$

This choice renders $I_{higher}=0$ in eq. (8), as the collection optics does not subtend any of the pattern harmonics ($k \geq 1$). In this case only $I_0$ (c.f. eq. [7]) contributes to image formation. It is noted that adopting this choice for $EC_2$ can provide a robust recovery of mask error sources.

It is noted that the scheme put forward in eq. (12) can be further extended to multiple (>2) inspections with a set of different exposure conditions. This may be used in case the number of possible (or suspected) mask error sources is larger (e.g., in order to account for haze). Or, alternatively, one may get an over-determined set of coupled equations (12), and then increase robustness of solution (to noise, e.g.) through least-mean square solution.

It is further noted that in the case of significant deviation of mask parameters from their nominal values, the Taylor series in eq. (12) contains higher order derivatives, and the equation set is no longer linear. Still, it may be solved numerically using methods such as Newton-Raphson and the like.

It is also noted that in the same way that an average intensity was derived from knowledge of the mask spectrum and the exposure conditions (the information on which is captured by the TCC factors), one may use eqs. (1), (2) and (5) in order to derive an expression for the amplitude of image modulation.

Test Case

Three different exposure conditions were numerically evaluated. These exposure conditions differ by the aperture of an illumination system that was simulated in order to provide simulated images of a mask. The function that was calculated was an average intensity and its partial derivatives (w.r.t line width and MoSi phase) for a simple, dense, attPSM (MoSi 6%) pattern, with half-pitch 40 nm (on wafer), and 50% line duty cycle.

Figures 6A, 6B, 6C:
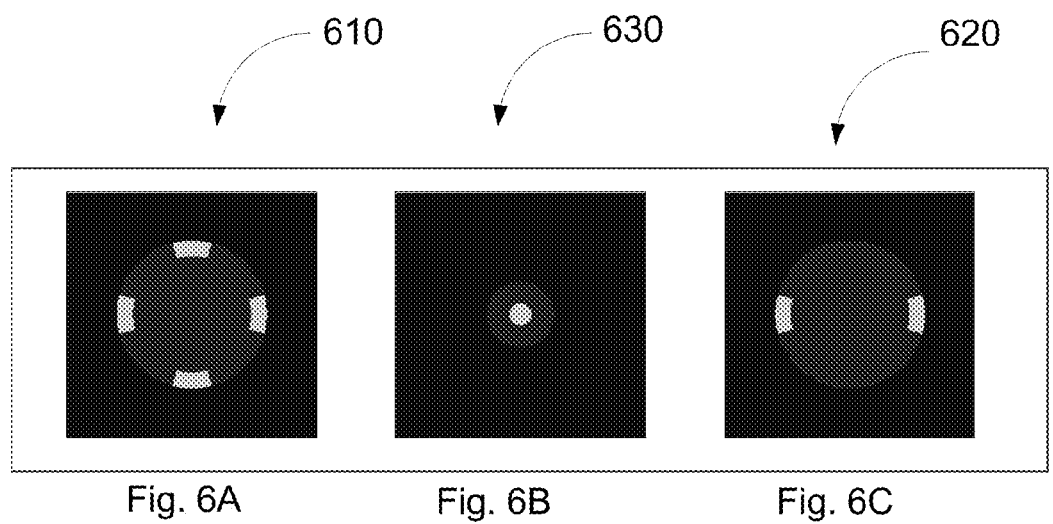
FIGS. 6A-6C illustrate few apertures according to an embodiment of the invention.

The first exposure condition is an aerial image condition and is characterized by aperture 610 illustrated in FIG. 6A—Numerical aperture of 0.337, 30° quadrupole with $\sigma_{in}=0.85$, $\sigma_{out}=1.0$. Aperture 610 includes four annular slots 611, 612, 613 and 614 that are positioned around an imaginary circle and spaced apart by 90 degrees from each other.

The second exposure condition differs from an aerial image and is characterized by aperture 620 illustrated in FIG. 6B—low-NA/low-σ: $NA_{coll}=0.15$, σ=0.1. Aperture 620 has a single circular slot 621 at its center.

The third exposure condition is an aerial image condition and is characterized by aperture 630 illustrated in FIG. 6C—Numerical aperture of 0.337, 30° dipole with $\sigma_{in}=0.85$, $\sigma_{out}=1.0$. Aperture 630 includes two annular slots 631 and 632 that are positioned around an imaginary circle and spaced apart by 180 degrees from each other.

$NA_{coll}$ is the numerical aperture of the collection optics, equal to ¼ of the corresponding projection NA (due to optical reduction by the stepper). Whereas the low-NA/low-σ exposure condition results in a non-modulated image (since λ/NA (1+σ)>p), the two plausible "aerial" exposure conditions result in modulated images.

TCC factors were computed for the three different exposure conditions, from which partial derivatives of $I_{av}$ w.r.t duty cycle and phase were computed. The table below summarizes the results. The intensity is normalized to 1 for a large clear region on the mask:

Table 1 illustrates average intensities and sensitivities (partial derivative) for the three mentioned above exposure conditions:

| Exposure condition | $I_{av}$ [clear→1] | $\partial I_{av}/\partial d$ [nm$^{-1}$] | $\partial^2 I_{av}/\partial d^2$ [nm$^{-2}$] | $\partial I_{av}/\partial \phi$ [deg$^{-1}$] | $\partial^2 I_{av}/\partial \phi^2$ [deg$^{-2}$] |
|---|---|---|---|---|---|
| Aerial #1 (cquad) | 0.22 | 0.0117 | $5.5 \times 10^{-5}$ | $2.55 \times 10^{-4}$ | $1.05 \times 10^{-4}$ |
| Non-aerial (low-NA/low-s) | 0.3 | 0.0117 | $5.5 \times 10^{-5}$ | $1.25 \times 10^{-4}$ | $1.0 \times 10^{-4}$ |
| Aerial #2 (dipole) | 0.14 | 0.0117 | $5.5 \times 10^{-5}$ | $3.85 \times 10^{-4}$ | $1.15 \times 10^{-4}$ |

It is evident from the table that while $1^{st}$ order derivatives w.r.t. duty cycle are enough to recover the CD error induced by mask feature size variations, the $2^{nd}$ derivative with respect to phase is almost as large as the $1^{st}$ order derivative, and cannot therefore be neglected.

Moreover, the table demonstrates a large discrepancy between the phase derivatives ($1^{st}$ and $2^{nd}$ orders) between different exposure conditions.

This enables a meaningful solution of the system, allowing a robust recovery of mask error source for even small mask perturbations.

Figures 7A, 7B, 7C:
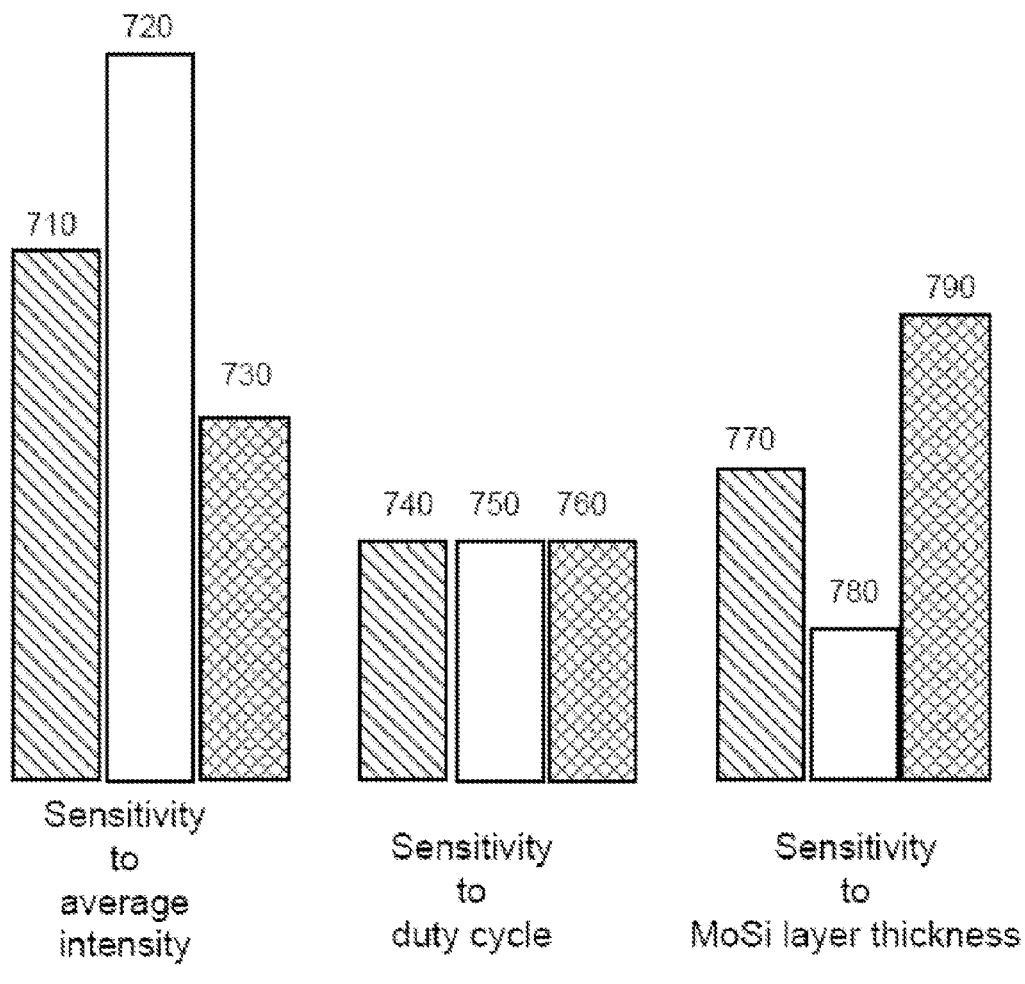
FIGS. 7A-7C illustrate examples of sensitivities according to an embodiment of the invention.

FIGS. 7A, 7B and 7C illustrate the sensitivities of three exposure conditions to average intensity, duty cycle and MoSi layer phase and transparency parameters, respectively, according to an embodiment of the invention.

Box 710 illustrates the sensitivity to average intensity when the exposure condition is "cquad". Box 720 illustrates the sensitivity to average intensity when the exposure condition is "dipole". Box 730 illustrates a sensitivity to average intensity when the exposure condition is "low NA/low s".

Box 740 illustrates the sensitivity to duty cycle when the exposure condition is "cquad". Box 750 illustrates the sensitivity to duty cycle when the exposure condition is "dipole". Box 760 illustrates a sensitivity to duty cycle when the exposure condition is "low NA/low s".

Box 770 illustrates the sensitivity to MoSi layer thickness when the exposure condition is "cquad". Box 780 illustrates the sensitivity to MoSi layer thickness when the exposure condition is "dipole". Box 790 illustrates a sensitivity to MoSi layer thickness when the exposure condition is "low NA/low S".

It is noted that the mentioned above equations can be extended to recover mask error source also for sparse and semi-sparse patterns. Indeed, the strong dependence of $\partial I_{av}/\partial \phi$ on the particular exposure condition indicates that the coupled equations in (12) remain non-degenerate, thus allowing a robust recovery of the sought mask error source ($\Delta d$, $\Delta \phi$). The applicability of the method for semi-sparse and sparse patterns is the reason for the apparently cumbersome series formalism in eqs. (5)-(8).

Figure 8:
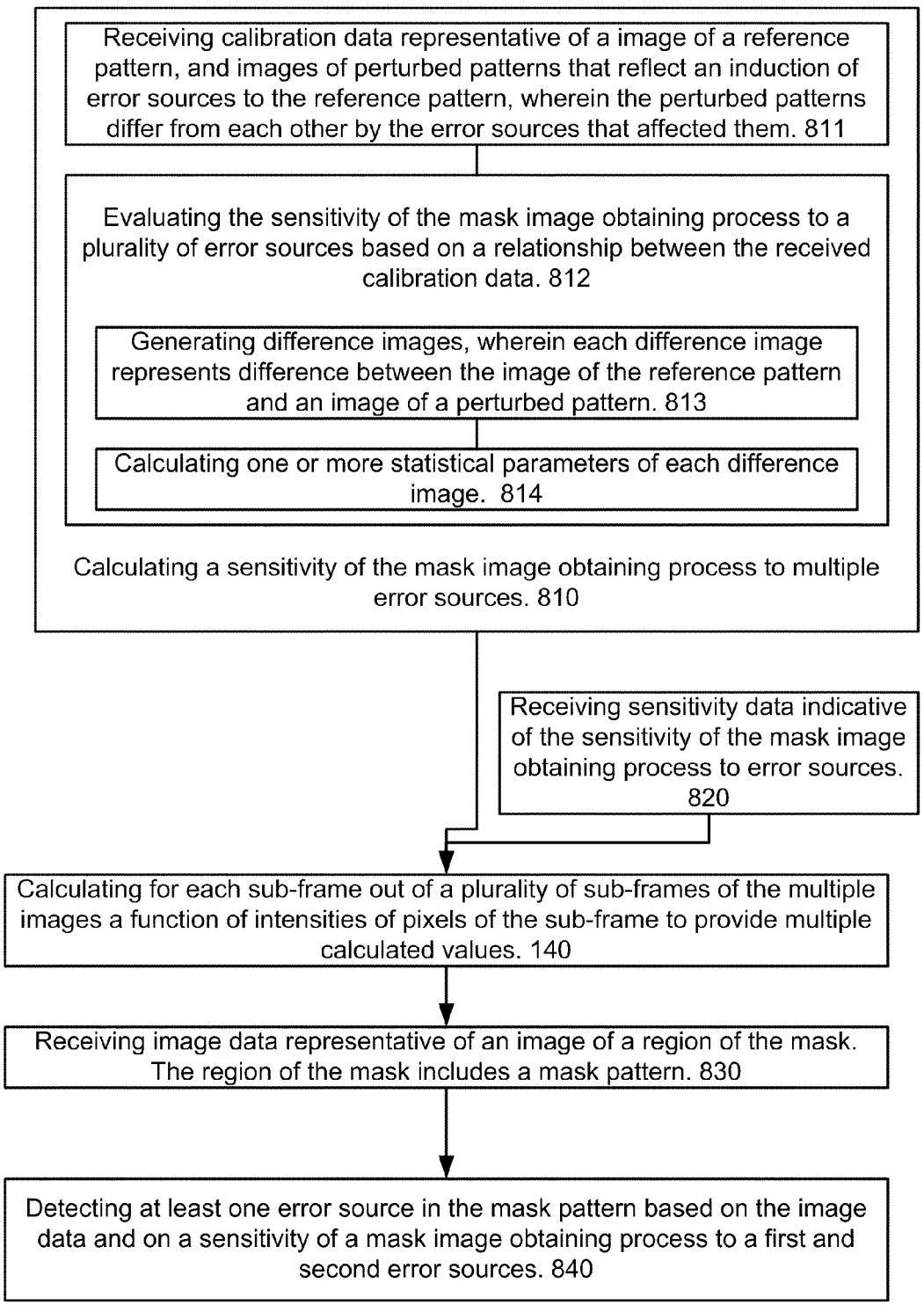
FIG. 8 illustrates a method according to an embodiment of the invention.

FIG. 8 illustrates method 800 for evaluating error sources associated with a mask, according to an embodiment of the invention.

Method 800 may be executed by system 500 of FIG. 5, by a system that receives data from image obtainer 530 but this is not necessarily so.

Method 800 starts by either one of stage 810 and 820.

Stage 810 includes calculating a sensitivity of the mask image obtaining process to multiple error sources. The error sources may include a first error source and a second error source, three error sources and even more. The error sources may be linked to each other or may be indifferent to each other.

The sensitivity data may describe the effect of each error source or a combination of a plurality of error sources on an image obtained by the mask image obtaining process.

An error source may affect one or more parameters of the image such as a critical dimension of a pattern (as reflected by the image), a statistical function (variance, mean value) of such a critical dimension, an intensity variation of the image, and the like.

Stage 810 includes: (i) stage 811 of receiving calibration data representative of a image of a reference pattern, and images of perturbed patterns that reflect an induction of error sources to the reference pattern, wherein the perturbed patterns differ from each other by the error sources that affected them; and (ii) stage 812 of evaluating the sensitivity of the mask image obtaining process to a plurality of error sources based on a relationship between the received calibration data.

Stage 811 can include generating the calibration data.

If a first and second error sources are being evaluated then stage 811 includes receiving an image a first perturbed pattern and an image of a second perturbed pattern, wherein the first perturbed pattern reflects an induction of the first error source to the reference pattern, wherein the second perturbed pattern reflects an induction of the second error source to the reference pattern. In this case stage 812 includes evaluating the sensitivity of the mask image obtaining process to the first and second error sources based on a relationship between the received calibration data.

If three or more error sources are being evaluated then stage 811 includes receiving an image a three or more perturbed patterns. In this case stage 812 includes evaluating the sensitivity of the mask image obtaining process to each of the three or more error sources based on a relationship between the received calibration data.

According to an embodiment of the invention the image of the reference pattern is obtained by a mask image obtaining process that comprises simulation of a lithographic process.

According to an embodiment of the invention the image of the reference pattern is obtained by processing multiple images of ideally identical patterns of a mask that were obtained by a mask image obtaining process that comprises optically illuminating the mask. This image of the reference pattern can be regarded as a "golden" reference that is based on images that are optically obtained and are not purely based on simulation.

According to an embodiment of the invention stage 812 includes stage 813 of generating difference images, wherein each difference image represents difference between the image of the reference pattern and an image of a perturbed pattern. Stage 813 is followed by stage 814 of calculating one or more statistical parameters of each difference image. These one or more statistical parameters may reflect the sensitivity of the mask image obtaining process to one or more error sources.

If, for example, a first and a second error sources are evaluated then stage 813 include generating a first difference image that reflects differences between the image of the first perturbed pattern and the image of the reference pattern and generating a second difference image that reflects differences between the image of the second perturbed pattern and the image of the reference pattern.

In this case stage 814 includes calculating one or more statistical parameters of the first and second difference images. At least one statistical parameter of the first difference image reflects the sensitivity of the mask image obtaining process to the first error source. At least one statistical parameter of the second difference image reflects the sensitivity of the mask image obtaining process to the second error source.

At least one statistical parameter of each of the first and second difference images may be associated with a critical dimension.

A first error source may be a variation of a thickness of at least one layer of the mask. This layer may be a MoSi layer, A second error source may be a variation in a dimension of the mask pattern.

According to an embodiment of the invention stage 811 may include receiving calibration data representative of multiple images of the reference pattern, multiple images of each perturbed pattern out of a plurality of perturbed patterns: wherein multiple images of a same pattern are obtained at different illumination conditions.

The different illumination conditions comprise an aerial image condition.

Stage 820 includes receiving sensitivity data indicative of the sensitivity of the mask image obtaining process to a first and second error sources.

Stage 810 and 820 are followed by stage 830 of receiving image data representative of an image of a region of the mask. The region of the mask includes a mask pattern.

Stage 830 is followed by stage 840 of detecting at least one error source in the mask pattern based on the image data and on a sensitivity of a mask image obtaining process to a first and second error sources.

Stage 810 may include:

(a) simulating a region of a (periodic), unperturbed pattern of a mask, to obtain the aerial image $I_0(x,y)$;

(b) For each error source (each perturbation type) $m \in [1 \ldots M]$ simulating an image of a perturbed pattern (a pattern that is endowed with a very small perturbation of the type in. These images are denoted $I_{small}^{(m)}(x,y)$.

(c) Calculating difference images $\Delta I_{small}^{(m)}(x,y) = I_{small}^{(m)}(x,y) - I_0(x,y)$.

Extracting, for each image $I_{small}^{(m)}(x,y)$, $m \in [1 \ldots M]$, extract Critical Dimension variation $\delta CD_{small}^{(m)}$.

Stage 840 may include:

(a) Obtaining an image of a mask pattern—denoted $I(x,y)$ (b) Calculating a differential image: $\Delta I(x,y) = I(x,y) - I_0(x,y)$.

(c) Calculating the quantity E, wherein $$E(f_1, \ldots f_M) = \sum_{x,y} \left[ \Delta I(x,y) - \sum_{m=1}^{M} f_m \Delta I_{small}^{(m)}(x,y) \right]^2.$$

Wherein E is a least-mean-square "error" with "sensitivity factors" $f_m$, assuming that the perturbation that led to $\Delta I(x,y)$ can be decomposed into individual contribution by all the M perturbation types.

(d) Differentiating $E(f_1, \ldots f_M)$ w.r.t all the $f_m$'s ($m \in [1 \ldots M]$), and equating to 0 gives a set of the "best" (in the LMS-sense) $\hat{f}_m$'s:

Stage (d) may include:

1. Defining $$A_{km} = \sum_{x,y} [\Delta I_{small}^{(k)}(x,y) \Delta I_{small}^{(m)}(x,y)],$$

$$B_k = \sum_{x,y} [\Delta I(x,y) \Delta I_{small}^{(k)}(x,y)].$$

2. Finding the LMS solution for the set of "best" $\hat{f}_m$'s by solving the linear system $$\sum_{m=1}^{M} A_{km} \hat{f}_m = B_k, (k = 1 \ldots M).$$

And (e) Estimating the variations in the critical dimension of the mask of a object that is manufactured by utilizing the mask wafer CD:

$$\delta CD_{wafer} = \sum_{m=1}^{M} \hat{f}_m \delta CD_{small}^{(m)}.$$

Figure 9:
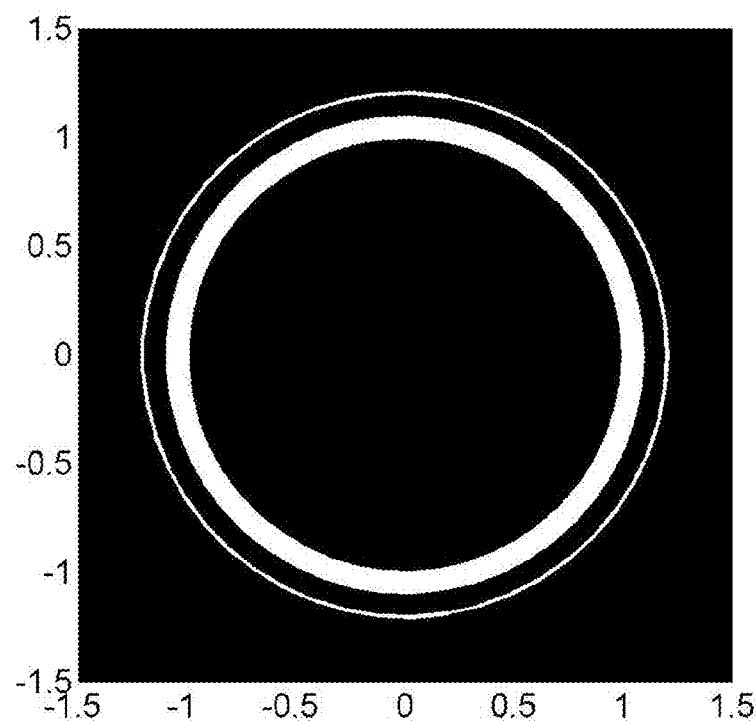
FIG. 9 illustrate two apertures according to an embodiment of the invention.
Figure 9:
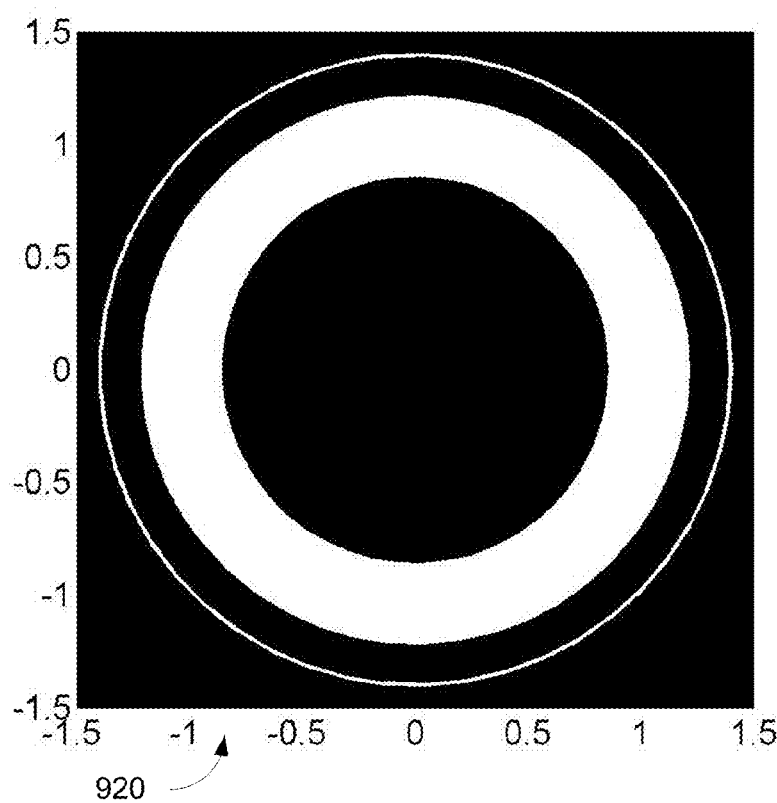

FIG. 9 illustrates an aerial illumination condition aperture 910 and a non-aerial illumination condition aperture 920 according to an embodiment of the invention.

Aerial illumination condition aperture 910 (also referred to as AI) is characterized by a Numerical Aperture (NA) of 1.204, it has an annular shape of 0.826/0.913 (sigma in/out).

Non-aerial illumination condition aperture 920 (also referred to as OAC) is characterized by NA of 1.4, it has an annular shape of 0.612/0.874 (sigma in/out).

These two apertures (910, 920) were used to simulate the sensitivity of the mask image obtaining process to each of three error sources—variation of MoSi layer thickness, variation of y-axis length of a rectangular mask aperture and variation of x-axis length of a rectangular mask aperture.

Figures 10A, 10B:
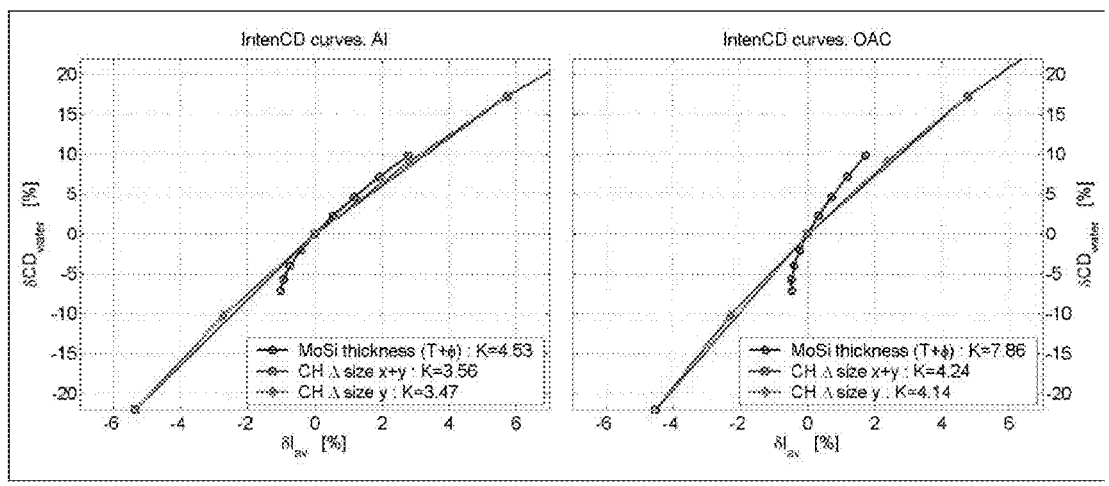
FIGS. 10A and 10B illustrate relationships between an average intensity ($\delta I$) of sub-frames of each obtained image and differences ($\delta CD$) in the critical dimension of each pattern for various illumination conditions according to an embodiment of the invention.

The sensitivities to each of the three error sources per each illumination condition (using aperture 910 or 920) are illustrated as multiple graphs in FIGS. 10A and 10B. These graphs illustrate the relationship between an average intensity ($\delta I$) of sub-frames of each obtained image and differences ($\delta CD$) in the critical dimension of each pattern for AI (FIG. 10A) and OAC (FIG. 10B) illumination conditions.

FIGS. 11A-11D illustrate sensitivity and estimation errors for multiple illumination conditions according to an embodiment of the invention.

The three error sources that were estimated were: (i) MoSi thickness variations alone (represented by blue markers), (ii) aperture y-axis variations (represented by red markers) and (iii) "Composite" error sources where both MoSi thickness and C/H y size are changed simultaneously (represented by green markers).

Figure 11A:
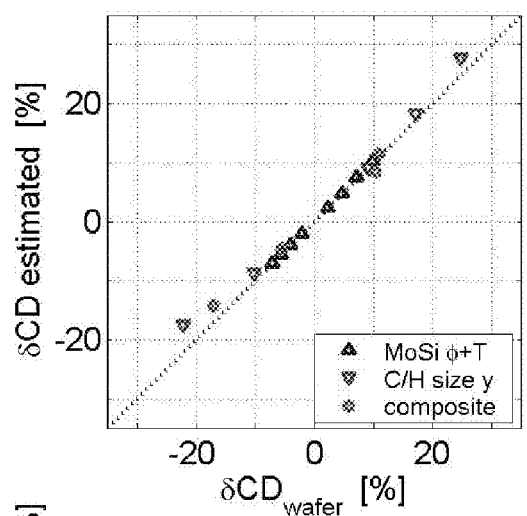
FIGS. 11A-11D illustrate sensitivity and estimation errors for multiple illumination conditions according to an embodiment of the invention.

FIG. 11A illustrates estimated Critical Dimension variation obtained from images of a mask obtained by applying aperture 910 (AI) versus real critical dimensions of wafers manufactured by the mask.

Figure 11C:
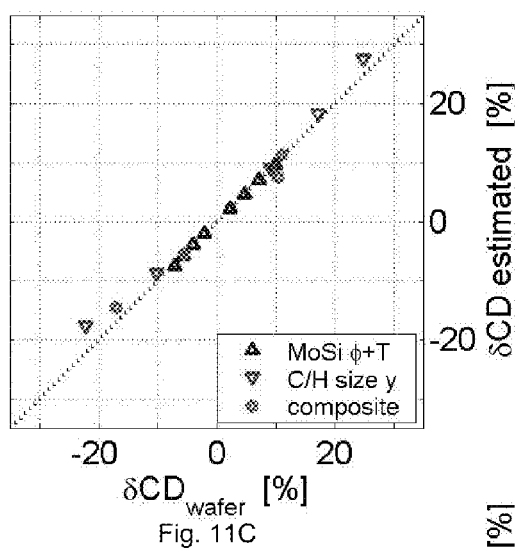
Figure 11B:
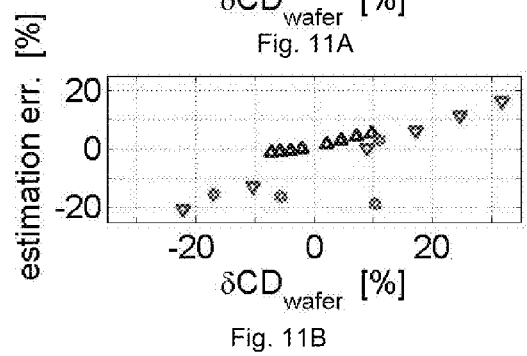

FIG. 11B illustrates the relative error of a critical dimension estimation (relative to the true critical dimension variation of the wafer) under AI conditions.

FIG. 11C illustrates estimated Critical Dimension variation obtained from images obtained of a mask by applying aperture 920 (OAC) versus real critical dimensions variations of wafers manufactured by the mask.

Figure 11D:
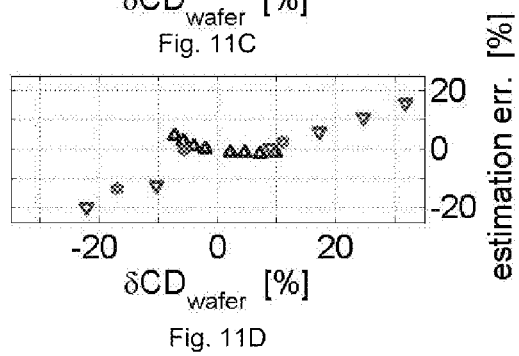

FIG. 11D illustrates the relative error of the critical dimension estimation (relative to the true critical dimension variation of the wafer) under OAC conditions.

Those skilled in the art will readily appreciate that various modifications and changes can be applied to the embodiments of the invention as hereinbefore described without departing from its scope defined in and by the appended claims.

What is claimed is:

1. A method for evaluating error sources associated with a mask, the method comprising:
   receiving, by an interface, data representative of multiple images of the mask, wherein the multiple images were obtained at different exposure conditions;
   calculating, for each sub-frame out of a plurality of sub-frames of the multiple images, by a processor communicatively coupled to the interface, a function of intensities of pixels of the sub-frame to provide multiple calculated values; and
   detecting, by the processor, the error sources based on the calculated values and based on sensitivities of the function to each error source.

2. The method according to claim 1 wherein the function is an intensity integral.

3. The method according to claim 1 comprising calculating, by the processor, for at least one sub-frame multiple functions of intensities of pixels the at least one sub-frame to provide multiple calculated values.

4. The method according to claim 3 wherein the function is an intensity integral.

5. The method according to claim 3 wherein the function is a variance of intensities.

6. The method according to claim 1 comprising comparing, by the processor, between calculated values associated with sub-frames positioned at a same location within different frames.

7. The method according to claim 1 wherein one image set is obtained by applying an aerial imaging condition and at least one other image set is obtained at an exposure condition that differs from the aerial imaging condition.

8. The method according to claim 1 wherein one image set is obtained by applying an aerial imaging condition and at least one other image set is obtained at a low numerical aperture.

9. The method according to claim 1 comprising calculating, by the processor, sensitivities of the function to each error source by simulating changes in a simulated mask, simulating images obtained from an illumination of the simulated mask, calculating the function for simulated sub-frames to provide calculated values, and comparing between the calculated values.

10. The method according to claim 1 comprising calculating, by the processor, sensitivities of the function to each error source by simulating changes in a simulated mask, simulating images obtained from an illumination of the simulated mask at multiple illumination conditions, calculating the function for simulated sub-frames to provide the calculated values and comparing between calculated values.

11. The method according to claim 1 comprising determining, by the processor, variations of a feature of an article that is manufactured by utilizing the mask.

12. The method according to claim 1 comprising determining, by the processor, a contribution of an error source that is related to changes in a thickness of an attenuated phase shifting layer of the mask.

13. A system for evaluating error sources associated with a mask, the system comprising: an interface that receives data representative of multiple images of the mask, wherein the multiple images were obtained at different exposure conditions; and a processor that is configured to calculate, for each sub-frame out of a plurality of sub-frames of the multiple images, a function of intensities of pixels of the sub-frame to provide multiple calculated values; and to detect the error sources based on the calculated values and in response to sensitivities of the function to each error source.

14. The system according to claim 13 wherein the function is an intensity integral.

15. The system according to claim 13 wherein the processor is configured to calculate, for at least one sub-frame, multiple functions of intensities of pixels of the at least one sub-frame to provide multiple calculated values.

16. The system according to claim 15 wherein the function is an intensity integral.

17. The system according to claim 15 wherein the function is a variance of intensities.

18. The system according to claim 13 wherein the processor is configured to compare between calculated values associated with sub-frames positioned at a same location within different frames.

19. The system according to claim 13 wherein one image is obtained by applying an aerial imaging condition and at least one other image is obtained at an exposure condition that differs from the aerial imaging condition.

20. The system according to claim 13 wherein one image is obtained by applying an aerial imaging condition and at least one other image is obtained at a low numerical aperture.

21. The system according to claim 13 wherein the processor is configured to calculate sensitivities of the function to each error source by simulating changes in a simulated mask, simulating images obtained from an illumination of the simulated mask, calculating the function of the intensities of pixels of a sub-frame for multiple simulated sub-frames, and comparing between calculated values.

22. The system according to claim 13 wherein the processor is configured to calculate sensitivities of the function to each error source by simulating changes in a simulated mask, simulating images obtained from an illumination of the simulated mask at multiple illumination conditions, calculating the function of the intensities of pixels of a sub-frame for multiple simulated sub-frames, and comparing between calculated values.

23. The system according to claim 13 wherein the processor determines variations of a feature of an article that is manufactured by utilizing the mask.

24. The system according to claim 13 wherein the processor determines a contribution of an error source that is related to changes in a thickness of an attenuating phase shifting layer of the mask.

* * * * *